Figure 1:
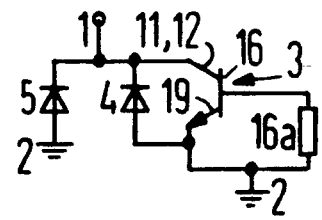

United States Patent [19]

Becker

[11] Patent Number: 5,187,562
[45] Date of Patent: Feb. 16, 1993

[54] INPUT PROTECTION STRUCTURE FOR INTEGRATED CIRCUITS

[75] Inventor: Burkhard Becker, München, Fed. Rep. of Germany

[73] Assignee: Siemens Aktiengesellschaft, Munich, Fed. Rep. of Germany

[21] Appl. No.: 606,036

[22] Filed: Oct. 30, 1990

[30] Foreign Application Priority Data

Oct. 30, 1989 [DE] Fed. Rep. of Germany ..... 89120144

[51] Int. Cl.$^5$ ..................... H01L 27/02; H01L 29/72; H01L 29/78
[52] U.S. Cl. .................................. 257/539; 257/577
[58] Field of Search .......................... 357/51, 34, 23.13

[56] References Cited

U.S. PATENT DOCUMENTS

| 4,228,451 | 10/1980 | Priel et al. ............................. 357/51 |
| 4,264,941 | 4/1981 | London .................................. 361/91 |
| 4,486,770 | 12/1984 | Woodwards . |
| 4,800,416 | 1/1989 | Musemeci ............................ 357/34 |

FOREIGN PATENT DOCUMENTS

| 3616394 | 12/1986 | Fed. Rep. of Germany . |
| 54-69391 | 6/1979 | Japan ..................................... 357/71 |
| 56-104465 | 8/1981 | Japan ..................................... 357/71 |
| 58-12343 | 1/1983 | Japan ..................................... 357/71 |
| 60-59762 | 4/1985 | Japan ..................................... 357/71 |

OTHER PUBLICATIONS

Patent Abstracts of Japan, vol. 5, No. 145 (E-74)(817) Sep. 12, 1981, & JP-1-5679463 (Matsushita) Jun. 30, 1981.
Patent Abstracts of Japan, vol. 9, No. 193 (E-334)(1916) Aug. 9, 1985, & JP-A-6059762 (Nippon Denki) Apr. 6, 1985.
IBM Technical Disclosure Bulletin, vol. 20, No. 11B, Apr. 1978, New York, US; p. 4811.
Patent Abstracts of Japan, vol. 6, No. 103 (E-112)(981) Jun. 12, 1982, & JP-A-5734361 (Tokyo) Feb. 24, 1982.
Publication: Technologie Hochintegrierter Schaltungen, 1988, pp. 67-72, Springer-Verlag.

*Primary Examiner*—Jerome Jackson, Jr.
*Assistant Examiner*—D. Monin
*Attorney, Agent, or Firm*—Herbert L. Lerner; Laurence A. Greenberg

[57] ABSTRACT

An input protection structure for integrated circuits to be connected between an input and a reference potential includes a resistor. At least one transistor has a collector connected to the input, a base connected through the resistor to the reference potential, and an emitter connected to the reference potential. A semiconductor substrate has a first conduction type. The collector is in the form of a buried collector of a second conduction type in the semiconductor substrate. The base is in the form of at least one doped zone of the first conduction type having a base connection. The emitter is in the form of a doped zone of the second conduction type having an emitter connection. The resistor is in the form of at least one further doped zone of the first conduction type being connected to the emitter exclusively through the emitter connection and being connected to the base exclusively through the base connection.

8 Claims, 1 Drawing Sheet

INPUT PROTECTION STRUCTURE FOR INTEGRATED CIRCUITS

The invention relates to an input protection structure for integrated circuits to be connected between an input and a reference potential, including a resistor, at least one transistor having a collector connected to the input, a base connected through the resistor to the reference potential, and an emitter connected to the reference potential, and a semiconductor substrate of a first conduction type, the collector being in the form of a buried collector of a second conduction type in the semiconductor substrate, the base being in the form of at least one doped zone of the first conduction type having a base connection, and the emitter being in the form of a doped zone of the second conduction type having an emitter connection.

Integrated circuits require reliable protection against electrostatic discharges. Mechanisms relating to such electrostatic discharges are described in detail in German Published, Non-Prosecuted Application DE-OS 36 16 394. That publication discloses an input protection structure for bipolar integrated circuits in particular, which includes an npn transistor connected between an input and a reference potential, with its base being coupled (short-circuited) through a resistor and applied to reference potential, especially ground.

The technical construction of such a protection structure in a semiconductor substrate provides a typical bipolar transistor in an epitaxial layer on the surface of the substrate. The collector of the transistor is formed in the usual manner by the high-impedance epitaxial layer, and the base and emitter are typically formed by two corresponding diffusion zones in the epitaxial layer. With the typical structure of the transistor, premature surface openings can occur in the vicinity of the surface of the system because of the increased charge carrier density. That can reduce the capacity of the protection structure for handling electrostatic discharges.

A further input protection structure of the type in question is described in Published European Application No. 89 111 767.3. However, that structure is tailored to the specialized requirements that pertain when the epitaxial layer is quite thick, and it cannot be achieved advantageously except with bipolar integrated circuits and with adjacent components being insulated by means of diffusion zones.

It is accordingly an object of the invention to provide an input protection structure for integrated circuits, which overcomes the hereinafore-mentioned disadvantages of the heretofore-known devices of this general type and which assures reliable protection in bipolar integrated circuits with insulation of adjacent components by oxide zones, while being simple to manufacture.

With the foregoing and other objects in view there is provided, in accordance with the invention, an input protection structure for integrated circuits to be connected between an input and a reference potential, comprising a resistor, at least one transistor having a collector connected to the input, a base connected through the resistor to the reference potential, and an emitter connected to the reference potential, a semiconductor substrate of a first conduction type, the collector being in the form of a buried collector of a second conduction type in the semiconductor substrate, the base being in the form of at least one doped zone of the first conduction type having a base connection, the emitter being in the form of a doped zone of the second conduction type having an emitter connection, and the resistor being in the form of at least one further doped zone of the first conduction type being connected to the emitter exclusively through the emitter connection and being connected to the base exclusively through the base connection.

In accordance with another feature of the invention, the resistor is formed of two parallel-connected resistor elements having substantially the same resistances.

In accordance with a further feature of the invention, the base includes a weakly doped zone having at least one highly doped subzone forming a base contact zone.

In accordance with an added feature of the invention, the base is connected to the base connection by the at least one highly doped base contact subzone.

In accordance with an additional feature of the invention, the resistor is a weakly doped zone produced simultaneously with the base.

In accordance with yet another feature of the invention, the weakly doped zone forming the resistor has two highly doped subzones forming contact zones being produced simultaneously with the base contact subzone, and the weakly doped zone forming the resistor is connected through one of the subzones to the base connection and through the other of the subzones to the emitter connection.

In accordance with yet a further feature of the invention, there is provided an epitaxial layer and a buried zone forming part of the collector, a first integrated diode being formed by the weakly doped zone and by a part of the epitaxial layer, and a second integrated diode being formed by the semiconductor substrate and the buried zone.

In accordance with a concomitant feature of the invention, the at least one transistor has a base-to-emitter zone, the epitaxial layer has a part being substantially separate from the base-to-emitter zone, and the first integrated diode and the resistor are disposed in the part of the epitaxial layer.

Other features which are considered as characteristic for the invention are set forth in the appended claims.

Although the invention is illustrated and described herein as embodied in an input protection structure for integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
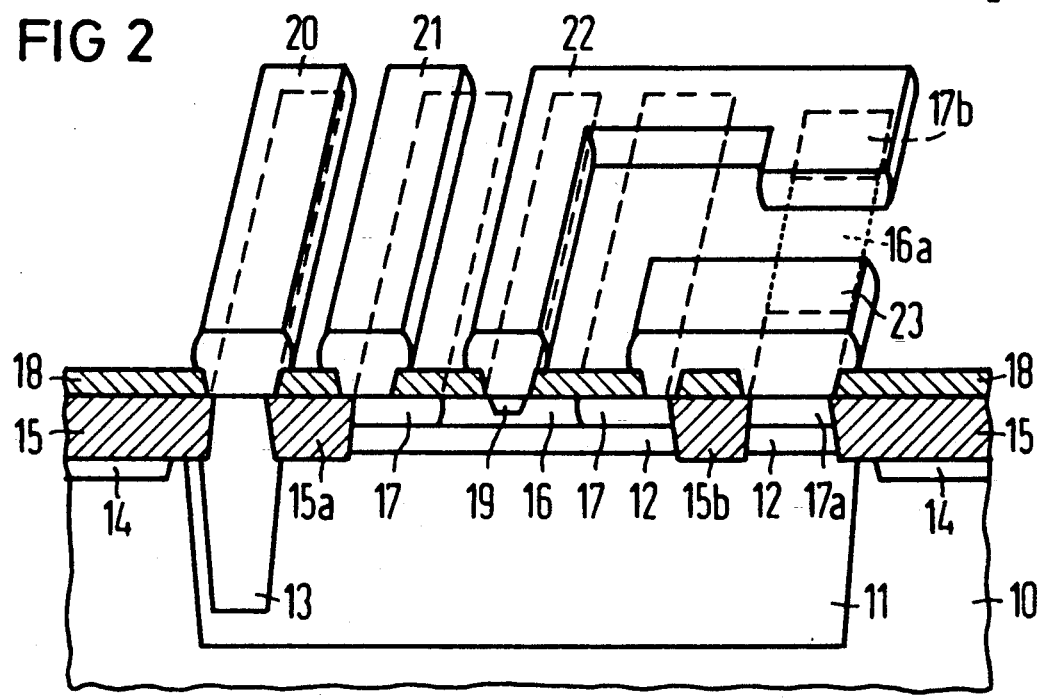
Figure 3:
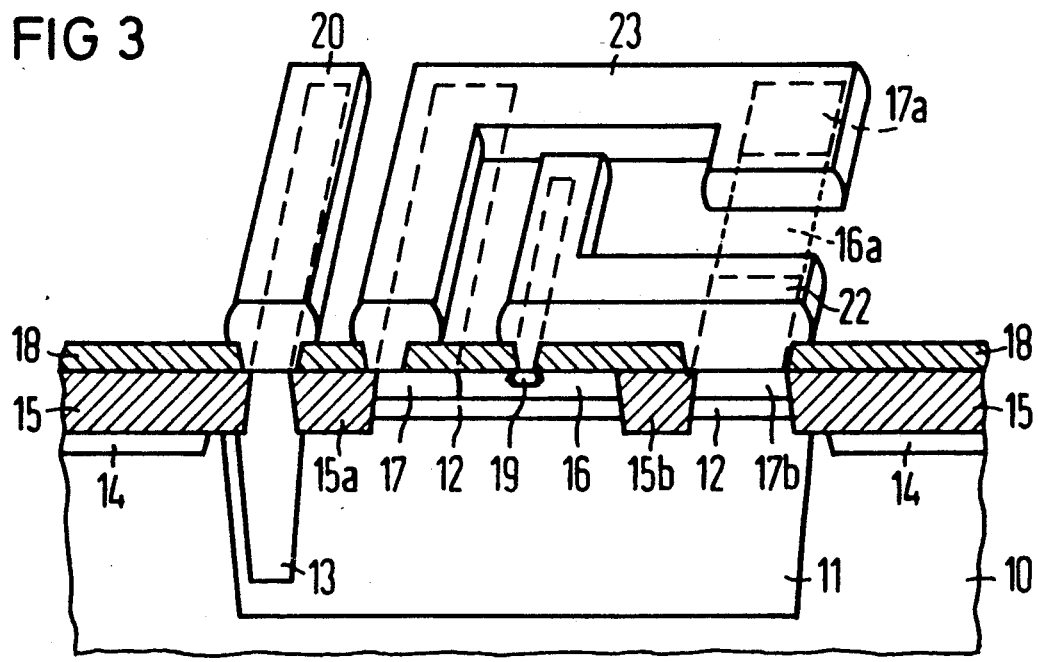

FIG. 1 is a substitute or equivalent schematic circuit diagram of an input protection structure in the form of a transistor having a resistor and two integrated diodes; and FIGS. 2 and 3 are fragmentary, diagrammatic, partly sectional and partly perspective views of two exemplary embodiments of an input protection structure of FIG. 1 in a semiconductor system. FIGS. 2 and 3 each show a section through the middle of an input protection structure, with an additional oblique view toward the rear. The full input protection structure is obtained by extending the structure symmetrically toward the front.

Referring now to the figures of the drawing in detail and first, particularly, to FIG. 1 thereof, there is seen a protection structure located between an input 1 of an integrated circuit, in particular a bipolar integrated circuit, and a reference potential 2, in particular ground. The protection structure includes a transistor 3, a coupling provided by a resistor 16a between a base 16 and an emitter 19 of the transistor 3, a collector 11, 12 of the transistor 3, and first and second integrated diodes 4, 5. In particular, the collector 11, 12 of the transistor 3 is connected to the input 1, and a connecting point between the emitter 19 and the resistor 16a is connected to the reference potential 2. The two integrated diodes 4, 5 are likewise connected between the input 1 and the reference potential 2. The first diode 4 is connected directly parallel with the emitter-to-collector path of the transistor 3. Due to the circuit polarities of the transistor 3 and the diodes 4, 5 illustrated by FIG. 1, this protection structure works for electrostatic discharges of both polarities.

The reference numerals in FIG. 1, particularly for the transistor 3 and its wiring provided by means of the resistor 16a, are selected to match the reference numerals of the semiconductor system in FIG. 2, in which a first exemplary embodiment of the protection structure is shown. The protection structure in the semiconductor system of FIG. 2 will be described below in conjunction with a schematic production process sequence.

The starting point for the production of a semiconductor system of FIG. 2 is a semiconductor substrate 10 of a first conduction type, preferably the p-conduction type. A zone of the opposite, second conduction type, which is the n-type in the present example, and which in particular is highly doped, is first diffused into this semiconductor system in a conventional manner, such as by implantation in a subsequent temperature step, and a buried layer zone 11 is formed in subsequent manufacturing steps by means of this zone. In order to improve the operation of an insulating frame to be formed later around the protection structure, so-called channel stopper regions 14 of the first conduction type can be produced outside the buried layer zone 11 in a known manner. An epitaxial layer 12 of the second conduction type is then applied to the entire surface in the usual manner.

In order to insulate various parts of the protection structure from one another on one hand, and to insulate the entire structure from adjacent zones of the semiconductor system on the other hand, a conventional LOCOS technique is preferably used. Insulating techniques of this type are explained in a book by D. Widmann, H. Mahrer, and H. Friedrich, entitled Technologie hochintegrierter Schaltungen ALarge-scale Integrated Circuit TechnologyÜ, Springer-Verlag 1988, pp. 67-72. A suitable non-illustrated mask is applied, with the aid of which indentations of approximately half the thickness of the epitaxial layer are first etched into the epitaxial layer 12. These sites are then locally oxidized open. Preferably, LOCOS techniques of the type that produce oxide zones 15, 15a, 15b with a flat surface will be used. Alternatively, a trench insulation technique may be used, as is described on page 78 of the same book by Widmann et al. This likewise creates oxide zones 15, 15a, 15b. The oxide zones 15, 15a, 15b are preferably constructed in such a way that they have at least the thickness of the epitaxial layer 12, so that the epitaxial layer 12 is completely interrupted by them at the sites of the semiconductor system that they cover. If that should not be the case, then the channel stopper regions 14 assure complete insulation of the components from one another. In this way, the oxide zones form a part of an insulation frame around the input protection structure, to be completed later. The oxide zones 15a, 15b preferably extend through the epitaxial layer 12 into the buried layer zone 11 below it.

In order to provide low-impedance contacting of the buried layer zone 11 with a connection to be formed later, a highly doped contact zone 13, which in this example is of the n-conduction type, is diffused through the epitaxial layer 12 into the buried layer zone 11. Advantageously, this contact zone 13 is formed in such a way that it is defined or bordered laterally by the oxide zones 15, 15a.

Zones 16, 16a of the first conduction type, which in this case is accordingly the p type, and which in particular are weakly doped, are then diffused into the epitaxial layer 12, which in this case is n-doped. The zones 16 and 16a are insulated from one another at least by the oxide zone 15b at the surface of the semiconductor substrate 10 or of the epitaxial layer 12. Due to the high layer resistance of the zones 16, 16a, the doping may also be effected over the entire surface, that is without using a mask, without significantly changing the highly doped contact zone 13 as a result.

Highly doped subzones 17 are then diffused into the zones 16 and highly doped subzones 17a, 17b are at the same time diffused into the zone 16a. The subzones are of the same conduction type as the zones 16 and 16a, and accordingly in the present case are of the p-conduction type. The subzones 17 serve as contact zones for a later connection of the zone 16, and correspondingly the zones 17a, 17b serve as contact zones for the zone 16a.

A zone 19 of the second conduction type, which in this case is the n type, is then diffused into the zone 16. The depth of the zone 19 is dimensioned in such a way that it is separated from the epitaxial layer 12 by the weakly doped zone 16. Finally, an insulation layer 18, in particular being formed of silicon oxide, which is either applied at the same moment to the entire surface of the semiconductor system or has already been made in the preceding temperature steps of the diffusion processes, is structured in such a way that the contact zones 13, 17, 17b, 17a and the zone 19 can be connected. These zones are provided with conductor tracks 20, 21, 22, 23 as connections. The conductor track 20 is connected to the input 1 and the conductor track 22 is connected to the reference potential 2 in a non-illustrated manner. The conductor track 22 connects the zone 19 to the contact zone 17b, and the conductor track 23 connects the contact zones 17 and 17a to one another. The conductor track 21 serves merely to make the course of the potential homogeneous in the zones 16, 17 and is not contacted to the outside.

The portions of the insulation layer 18 located above the oxide zones 16 complete the aforementioned insulation frame 15, 18 encompassing the input protection structure. Based on the aforementioned zone structure, the npn transistor 3 of FIG. 1 is formed in the semiconductor system of FIG. 2 by the buried layer zone 11, with the epitaxial layer 12 as a collector, the zone 16 as the base, and the zone 19 as the emitter. The zone 13 is the collector contact zone, and the subzones 17 form the base contact zones. The conductor track 20 acts as as a collector connection to connect the collector 11, 12 of the transistor to the input 1 and the conductor track 22 acts as an emitter connection to connect the emitter 19 to the ground potential.

According to the invention, the resistor 16a is provided by the weakly doped zone 16a, it is connected to the base contact subzone 17 and thus to the base through the contact zone 17a and the conductor track 23 acting as a base connection, and is also connected to the emitter 19 through the contact zone 17b and the emitter connection 22. Aside from these conductor tracks 22, 23; the resistor 16a is insulated from the base 16 and the emitter 19 by the oxide zones 15, 15b and parts of the insulation layer 18. Through the use of the part of the epitaxial layer 12 that is located under the diffusion zone 16a, the resistor and the buried layer zone 11 form an integrated diode corresponding to the diode 4 of FIG. 1, to be described in detail below.

As already indicated, the input protection structure of FIG. 2 can be completed by adding a structure to the front of the illustrated structure at the section line being used, which is a mirror image of the illustrated structure. The complete input protection structure therefore has a further resistor, connected parallel to the resistor 16a. In other words, in the semiconductor system, the resistor 16a shown in FIG. 1 is provided by two parallel-connected resistors or resistor elements. This is especially advantageous when considering the electrical properties of the input protection structure to be explained below.

As mentioned above, in the semiconductor system of FIG. 2, the first integrated diode 4 of FIG. 1 is formed by the zone 16a and the part of the epitaxial layer 12 located under it, including the buried layer zone 11. This first diode 4 is thus connected parallel to the resistor 16a and to the collector-to-base junction, in other words parallel to the-emitter-to-collector path of the transistor, and is disposed in a part of the epitaxial layer 12 that is essentially separate from the transistor region. The second integrated diode 5 is formed by the semiconductor substrate 10 and the buried layer zone 11. The semiconductor substrate 10 should be connected to the reference potential 2 which is not illustrated in FIG. 2.

FIG. 3 shows a further embodiment of the invention, with the reference numerals selected to match FIG. 2. As can be seen, this second embodiment differs from the first by the omission of one of the two base-contact zones 17, by a different disposition of the emitter connection 22 which joins the resistor 16a to the emitter 19, and by a different disposition of the base connection 23, which joins the resistor 16a to the base contact zone 17 and thus to the base 16. The remaining structure and the course of the process for producing the protection structure of FIG. 3 match those of the protection structure of FIG. 2. In particular, the second exemplary embodiment of the input protection structure also corresponds to the substitute or equivalent circuit diagram of FIG. 1.

Part of a negative voltage pulse at the input 1 is dissipated by the second protective diode 4, which is connected in conducting direction. Another part drains out to the reference potential 2 through the emitter connection 22, which at the same time is the ground connection for the first protective diode 4. The first diode 4 is polarized in the forward direction. In this case, the protection structure operates in the inverse transistor mode and the sensitive base-to-emitter junction is polarized in the blocking direction. The connection of the first diode 4 in a separate part of the epitaxial layer 12, which is essentially separated from the emitter-to-base zone of the transistor 3 by the oxide insulation 15b, assures that the course of field intensity and current is made homogeneous, and thus protects the sensitive side or lateral zone of this junction.

A positive voltage pulse would switch the collector-to-base junction in the blocking direction and the base-to-emitter junction in the conducting direction. The result would be a $U_{CEO}$ breakdown. However, through the use of the resistor 16a, a flow of current can occur from the base 16, whereupon the protection structure changes to the normal transistor operating mode. The $U_{CEO}$ breakdown changes through the resistor 16a to a $U_{CER}$ breakdown. The first integrated diode 4, which is connected between the emitter 19 and the collector 11, 12, in a separate part of the epitaxial layer 12, makes a particularly positive impact in this case. Both the collector-to-base transition of the npn transistor 3 and the first diode 4 are polarized in the blocking direction. The positive input pulse builds up at both depletion layers, an excessive load on the side or lateral zone of the collector-to-base junction that is opposite the collector connection 20 is avoided, and a more uniform field intensity distribution is attained. Due to its short rise time, the protection structure then dissipates the voltage pulse before parallel components can be destroyed. The polarization of the sensitive base-to-emitter junction in the conducting direction also guarantees a high load capacity for the component.

The disposition of the connections and contact zones for the collector, base and emitter counteracts an excessive increase in the current density at the side or lateral zone of the emitter-to-base junction opposite the collector connection 20. This advantage becomes especially important in the first exemplary embodiment of FIG. 2. In contrast, the second exemplary embodiment of FIG. 3 has the advantage of requiring markedly less space.

The advantage of the protection structure shown is that it can be used for high signal voltages of the integrated circuit. The breakdown is determined by the $U_{CER}$ voltage, which is known to be higher than the $U_{CEO}$ voltage.

I claim:

1. Input protection structure for integrated circuits to be connected between an input and a reference potential, comprising:

a resistor, at least one transistor having a collector connected to the input, a base connected through said resistor to the reference potential, and an emitter connected to the reference potential, an integrated diode, a semiconductor substrate of a first conductivity type, said collector being in the form of a buried collector of a second conductivity type in said semiconductor substrate, said base being in the form of at least one doped zone of the first conductivity type having a base connection, said emitter being in the form of a doped zone of the second conductivity type having an emitter connection, said resistor being in the form of at least one further doped zone of the first conductivity type being connected to said emitter exclusively through said emitter connection and being connected to said base exclusively through said base connection, and said integrated diode being formed by said further doped zone of the first conductivity type and said buried collector.

2. Input protection structure according to claim 1, wherein said resistor is formed of two parallel-connected resistor elements having substantially the same resistances.

3. Input protection structure according to claim 1, wherein said base includes a weakly doped zone having at least one highly doped subzone forming a base contact zone.

4. Input protection structure according to claim 3, wherein said base is connected to said base connection by said at least one highly doped base contact subzone.

5. Input protection structure according to claim 4, wherein said resistor is a weakly doped zone produced simultaneously with said base.

6. Input protection structure according to claim 5, wherein said weakly doped zone forming said resistor has two highly doped subzones forming contact zones being produced simultaneously with said base contact subzone, and said weakly doped zone forming said resistor is connected through one of said subzones to said base connection and through the other of said subzones to said emitter connection.

7. Input protection structure according to claim 5, wherein said integrated diode is a first integrated diode, including an epitaxial layer and a buried zone forming part of said collector and a second integrated diode being formed by said semiconductor substrate and said buried zone, and wherein said first integrated diode is formed by said weakly doped zone and by a part of said epitaxial layer.

8. Input protection structure according to claim 7, wherein said at least one transistor has a base-to-emitter zone, said epitaxial layer has a part being substantially separate from said base-to-emitter zone, and said first integrated diode and said resistor are disposed in said part of said epitaxial layer.

* * * * *